United States Patent
Akiyama et al.

(10) Patent No.: US 11,776,603 B2
(45) Date of Patent: Oct. 3, 2023

(54) MAGNETORESISTANCE MEMORY DEVICE AND METHOD OF MANUFACTURING MAGNETORESISTANCE MEMORY DEVICE

(71) Applicants: Kioxia Corporation, Tokyo (JP); SK hynix Inc., Icheon-si (KR)

(72) Inventors: Naoki Akiyama, Seoul (KR); Kenichi Yoshino, Seongnam-si (KR); Gayoung Ha, Icheon-si (KR)

(73) Assignees: Kioxia Corporation, Tokyo (JP); SK HYNIX INC., Gyeonggi-Do (KR)

( * ) Notice: Subject to any disclaimer, the term of this patent is extended or adjusted under 35 U.S.C. 154(b) by 295 days.

(21) Appl. No.: 17/349,203

(22) Filed: Jun. 16, 2021

(65) Prior Publication Data
US 2022/0093146 A1    Mar. 24, 2022

(30) Foreign Application Priority Data
Sep. 18, 2020 (JP) .................... 2020-157291

(51) Int. Cl.
G11C 16/04 (2006.01)
G11C 11/16 (2006.01)
(Continued)

(52) U.S. Cl.
CPC ............ G11C 11/161 (2013.01); H10B 61/00 (2023.02); H10N 50/01 (2023.02); H10N 50/10 (2023.02);
(Continued)

(58) Field of Classification Search
CPC .................................................. G11C 11/161
See application file for complete search history.

(56) References Cited

U.S. PATENT DOCUMENTS

| | | |
|---|---|---|
| 9,373,775 B2 | 6/2016 | Sandhu et al. |
| 10,217,934 B2 | 2/2019 | Yang et al. |

(Continued)

FOREIGN PATENT DOCUMENTS

| | | |
|---|---|---|
| JP | 2015532013 A | 11/2015 |
| JP | 2018157154 A | 10/2018 |

(Continued)

OTHER PUBLICATIONS

U.S. Appl. No. 17/016,212, First Named Inventor: Shuichi Tsubata; Title: "Magnetoresistive Memory Device"; filed Sep. 9, 2020.
(Continued)

*Primary Examiner* — Pho M Luu
(74) *Attorney, Agent, or Firm* — Holtz, Holtz & Volek PC

(57) ABSTRACT

A magnetoresistance memory device includes; first and second switching elements; first and second layer stacks respectively on the first and second switching elements; a first insulator on a side surface of the first layer stack; and a second insulator on a side surface of the second layer stack. Each of the first and second switching elements includes a variable resistance material. Each of the first and second layer stacks includes first and second ferromagnetic layers and an insulating layer between the first and second ferromagnetic layers. A narrowest interval between the first and second insulators is narrower than a narrowest interval between the first and second switching elements.

20 Claims, 15 Drawing Sheets

(51) Int. Cl.
  *H10B 61/00* (2023.01)
  *H10N 50/01* (2023.01)
  *H10N 50/10* (2023.01)
  *H10N 50/80* (2023.01)
  *H10N 50/85* (2023.01)
  *H10N 70/00* (2023.01)

(52) U.S. Cl.
  CPC ............ *H10N 50/80* (2023.02); *H10N 50/85* (2023.02); *H10N 70/8833* (2023.02)

(56) References Cited

U.S. PATENT DOCUMENTS

| | | | |
|---|---|---|---|
| 10,727,276 B1* | 7/2020 | Lien | ........................ H10N 50/80 |
| 2018/0277595 A1 | 9/2018 | Miyakawa et al. | |
| 2019/0096461 A1 | 3/2019 | Koike et al. | |
| 2020/0052036 A1 | 2/2020 | Ikarashi et al. | |
| 2020/0185455 A1 | 6/2020 | Yang et al. | |
| 2020/0279994 A1 | 9/2020 | Yu et al. | |
| 2020/0328252 A1* | 10/2020 | Sun | ........................ H10N 50/10 |
| 2020/0343300 A1* | 10/2020 | Aggarwal | ............. H10N 50/01 |

FOREIGN PATENT DOCUMENTS

| | | |
|---|---|---|
| JP | 2019057660 A | 4/2019 |
| WO | 2018203459 A1 | 11/2018 |

OTHER PUBLICATIONS

U.S. Appl. No. 17/199,593, First Named Inventor: Kenichi Yoshino; Title: "Magnetic Memory Device and Method for Manufacturing the Same"; filed Mar. 12, 2021.

* cited by examiner

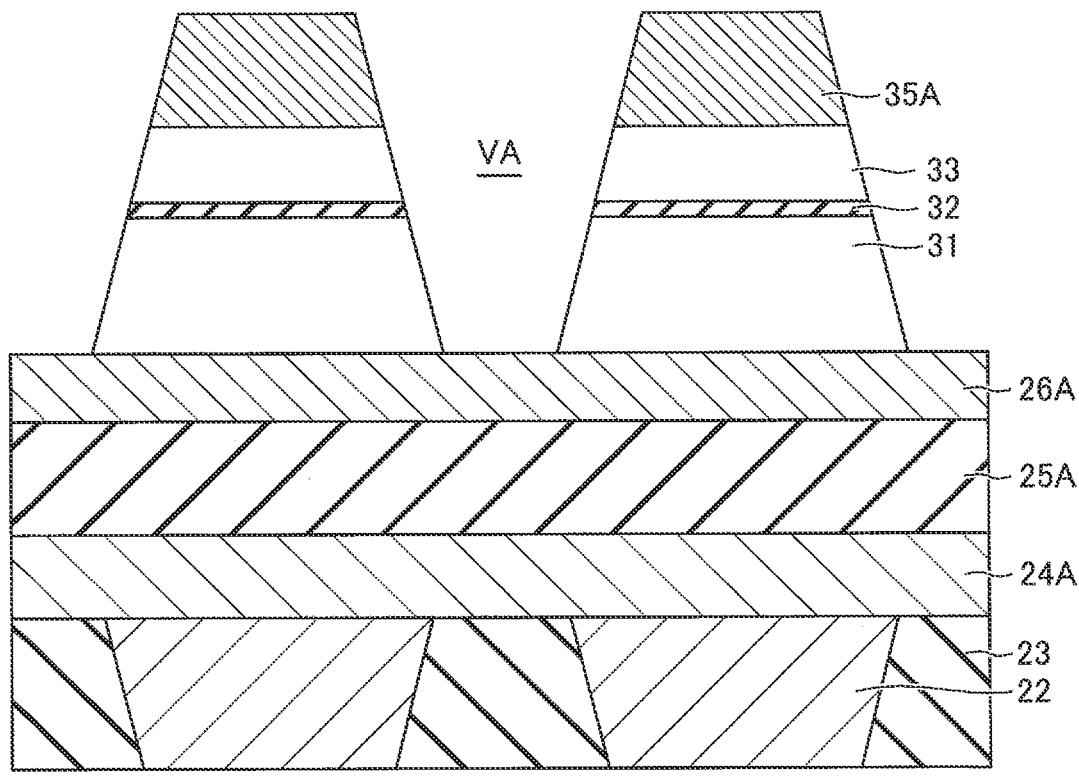
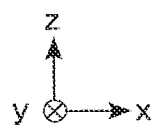
F I G. 7

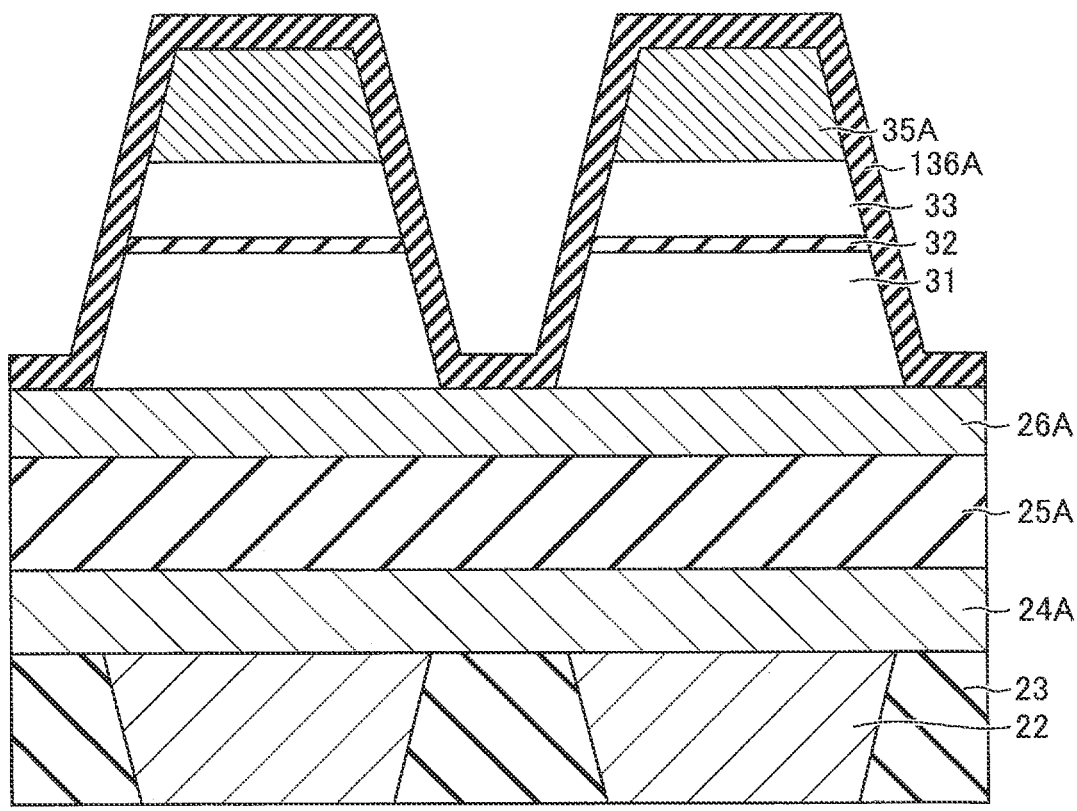
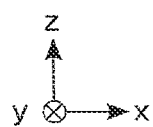
F I G. 13

MAGNETORESISTANCE MEMORY DEVICE AND METHOD OF MANUFACTURING MAGNETORESISTANCE MEMORY DEVICE

CROSS-REFERENCE TO RELATED APPLICATIONS

This application is based upon and claims the benefit of priority from Japanese Patent Application No. 2020-157291, filed Sep. 18, 2020, the entire contents of which are incorporated herein by reference.

FIELD

Embodiments described herein relate generally to a magnetoresistance memory device and a method of manufacturing a magnetoresistance memory device.

BACKGROUND

Memory devices using a magnetoresistance effect element are known.

BRIEF DESCRIPTION OF THE DRAWINGS

FIG. 7 is a diagram showing a structure at a point in time subsequent to that shown in FIG. 6.

FIG. 13 is a diagram showing a state of a magnetoresistance memory device in a reference manufacturing process.

DETAILED DESCRIPTION

Figure 1:
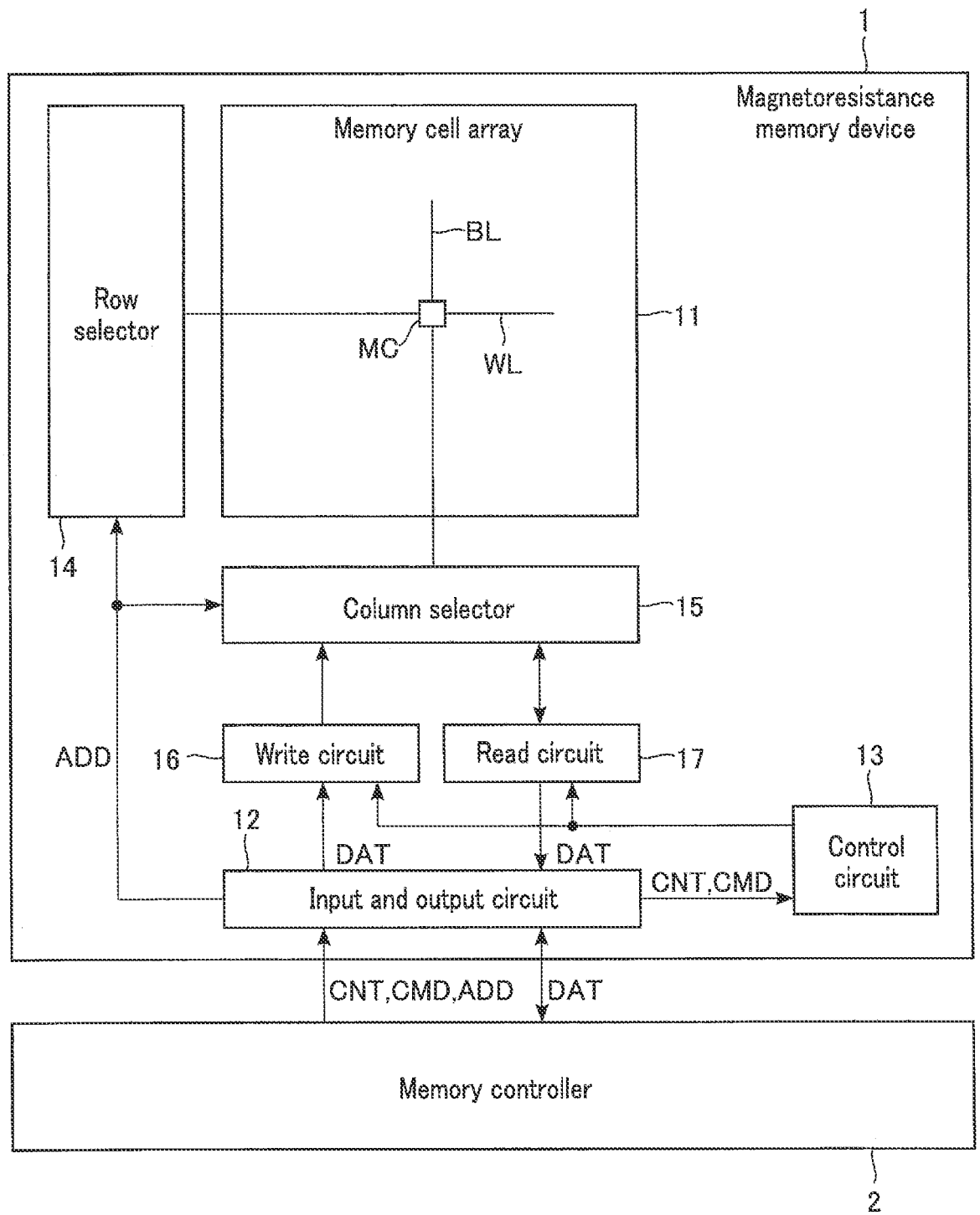
FIG. 1 shows the functional blocks of a magnetoresistance memory device in a first embodiment.

In general, according to one embodiment, a magnetoresistance memory device includes; a first switching element and a second switching element that each include a variable resistance material; a first layer stack and a second layer stack on the first switching element and the second switching element respectively; a first insulator on a side surface of the first layer stack; and a second insulator on a side surface of the second layer stack. Each of the first layer stack and the second layer stack includes a first ferromagnetic layer, a second ferromagnetic layer, and an insulating layer between the first ferromagnetic layer and the second ferromagnetic layer. A narrowest interval between the first insulator and the second insulator is narrower than a narrowest interval between the first switching element and the second switching element.

Embodiments will now be described with reference to the figures. In the following description, components with substantially the same functionalities and configurations will be referred to by the same reference numerals, and repeated descriptions may be omitted. In order to distinguish components having substantially the same function and configuration from each other, an additional numeral or letter may be added to the end of each reference numeral.

The figures are schematic, and the relation between the thickness and the area of a plane of a layer and the ratio of thicknesses of layers may differ from the actual ones. The figures may include components which differ in relations and/or ratios of dimensions in different figures. The entire description of a particular embodiment also applies to another embodiment unless explicitly mentioned otherwise or obviously eliminated. Each embodiment illustrates a device and a method for materializing the technical idea of that embodiment, and the technical idea of each embodiment does not limit the quality of the material, shape, structure, arrangement of components, etc. to those that will be described below.

The embodiments will be described using an xyz orthogonal coordinate system. In the description below, the term "below" as well as the terms derived therefrom and related thereto refer to a position having a smaller coordinate on the z-axis, and the term "above" as well as the terms derived therefrom and related thereto refer to a position having a larger coordinate on the z-axis.

1. First Embodiment

1.1. Structure (Configuration)

1.1.1. Overall Structure

FIG. 1 shows the functional blocks of a magnetoresistance memory device according to a first embodiment. As shown in FIG. 1, a magnetoresistance memory device 1 includes a memory cell array 11, an input and output circuit 12, a control circuit 13, a row selector 14, a column selector 15, a write circuit 16, and a read circuit 17.

The memory cell array 11 includes memory cells MC, word lines WL, and bit lines BL. The memory cells MC can store data in a non-volatile manner. Each memory cell MC is coupled to a single word line WL and a single bit line BL. Each word line WL is associated with a row. Each bit line BL is associated with a column. Selection of one row and selection of one or more columns specify one or more memory cells MC.

The input and output circuit 12 receives various types of a control signal CNT, various types of a command CMD, an address signal ADD, and data (write data) DAT, for example, from a memory controller 2, and transmits data (read data) DAT to, for example, the memory controller 2.

The row selector 14 receives the address signal ADD from the input and output circuit 12, and brings a single word line WL associated with the row specified by the received address signal ADD into a selected state.

The column selector 15 receives the address signal ADD from the input and output circuit 12 and brings bit lines BL associated with the column specified by the received address signal ADD into a selected state.

The control circuit 13 receives the control signal CNT and the command CMD from the input and output circuit 12. The control circuit 13 controls the write circuit 16 and the read circuit 17 based on a control instructed by the control signal CNT and the command CMD. Specifically, the control circuit 13 supplies voltages used for data writing to the write circuit 16 during the data writing to the memory cell array 11. Further, the control circuit 13 supplies voltages used for data reading to the read circuit 17 during the reading of data from the memory cell array 11.

The write circuit 16 receives write data DAT from the input and output circuit 12 and supplies the voltages used for data writing to the column selector 15 based on the control by the control circuit 13 and the write data DAT.

The read circuit 17 includes a sense amplifier, and based on the control of the control circuit 13, uses the voltages used for data reading to determine data stored in the memory cells MC. The determined data is supplied to the input and output circuit 12 as the read data DAT.

1.1.2. Circuit Configuration of Memory Cell Array

Figure 2:
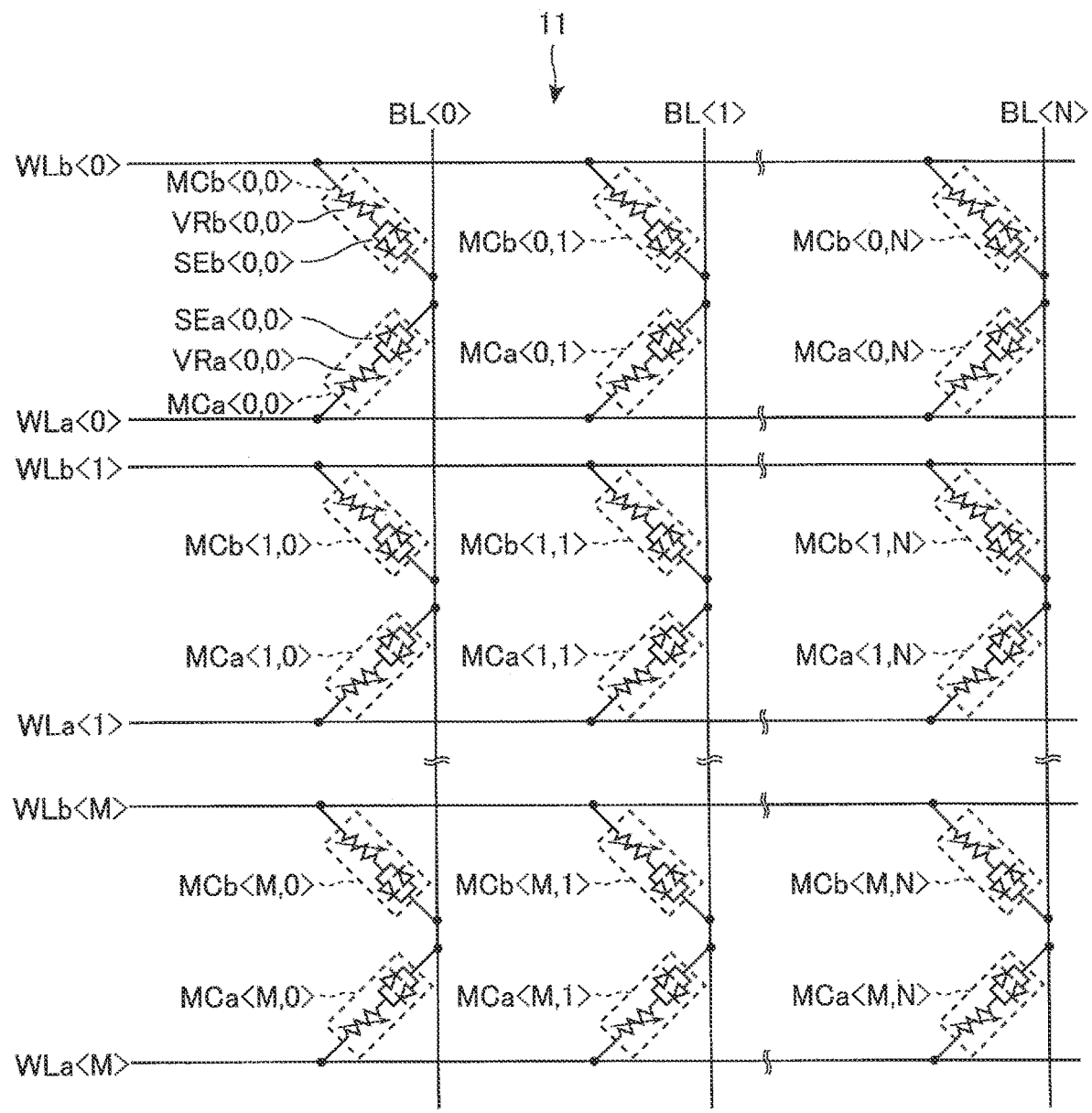
FIG. 2 is a circuit diagram of a memory cell array according to the first embodiment.

FIG. 2 is a circuit diagram of a memory cell array 11 according to the first embodiment. As shown in FIG. 2, the memory cell array 11 includes (M+1) word lines WLa (WLa<0>, WLa<1>, . . . , and WLa<M>) and (M+1) word lines WLb (WLb<0>, WLb<1>, . . . , and WLb<M>), where M is a natural number. The memory cell array 11 also includes (N+1) bit lines BL (BL<0>, BL<1>, . . . , and BL<N>), where N is a natural number.

Each of the memory cells MC (MCa and MCb) includes two nodes, and is coupled, at its first node, to a single word line WL and coupled, at its second node, to a single bit line BL. More specifically, the memory cells MCa encompass memory cells MCa<α,β> for all combinations of α and β, where α is every integer equal to or greater than 0 and equal to or less than M, and β is every integer equal to or greater than 0 and equal to or less than N, and the memory cell MCa<α, β> is coupled between the word line WLa<α> and the bit line BL<β>. Similarly, the memory cells MCb encompass memory cells MCb<α, β>, for all combinations of α and β, where α is every integer equal to or greater than 0 and equal to or less than M, and β is every integer equal to or greater than 0 and equal to or less than N, and the memory cell MCb<α, β> is coupled between the word line WLb<α> and the bit line BL<β>.

Each memory cell MC includes a single magnetoresistance effect element VR (VRa or VRb) and a single switching element SE (SEa or SEb). More specifically, the memory cell MCa<α, β> includes a magnetoresistance effect element VRa<α, β> and a switching element SEa<α, β> for all combinations of α and β, where α is every integer equal to or greater than 0 and equal to or less than M, and β is every integer equal to or greater than 0 and equal to or less than N. Each memory cell MCb<α, β> includes a magnetoresistance effect element VRb<α, β> and a switching element SEb<α, β> for all combinations of α and β, where α is every integer equal to or greater than 0 and equal to or less than M, and β is every integer equal to or greater than 0 and equal to or less than N.

In each memory cell MC, the magnetoresistance effect element VR and the switching element SE are coupled in series. The magnetoresistance effect element VR is coupled to a single word line WL, and the switching element SE is coupled to a single bit line BL.

The magnetoresistance effect element VR can switch between a low-resistance state and a high-resistance state. The magnetoresistance effect element VR can store 1-bit data, using the difference in the two resistance states. The switching element SE can be a switching element described below, for example. The switching element includes two terminals, and, when a voltage smaller than a first threshold is applied in a first direction between the two terminals, the switching element is in a high-resistance state, i.e., electrically non-conductive (in an OFF state). In contrast, when a voltage equal to or greater than a first threshold is applied in the first direction between the two terminals, the switching element is in a low-resistance state, i.e., electrically conductive (in an ON state). The switching element is further equipped with a function similar to that of switching between the high-resistance state and the low-resistance state based on the magnitude of the voltage applied in the first direction, with respect to a second direction opposite to the first direction. A switching element is a bidirectional switching element. By turning the switching element on or off, it is possible to perform control as to whether or not to supply a current to a magnetoresistance effect element VR coupled to the switching element, namely, whether or not to select the magnetoresistance effect element VR.

1.1.3. Structure of Memory Cell Array

Figure 3:
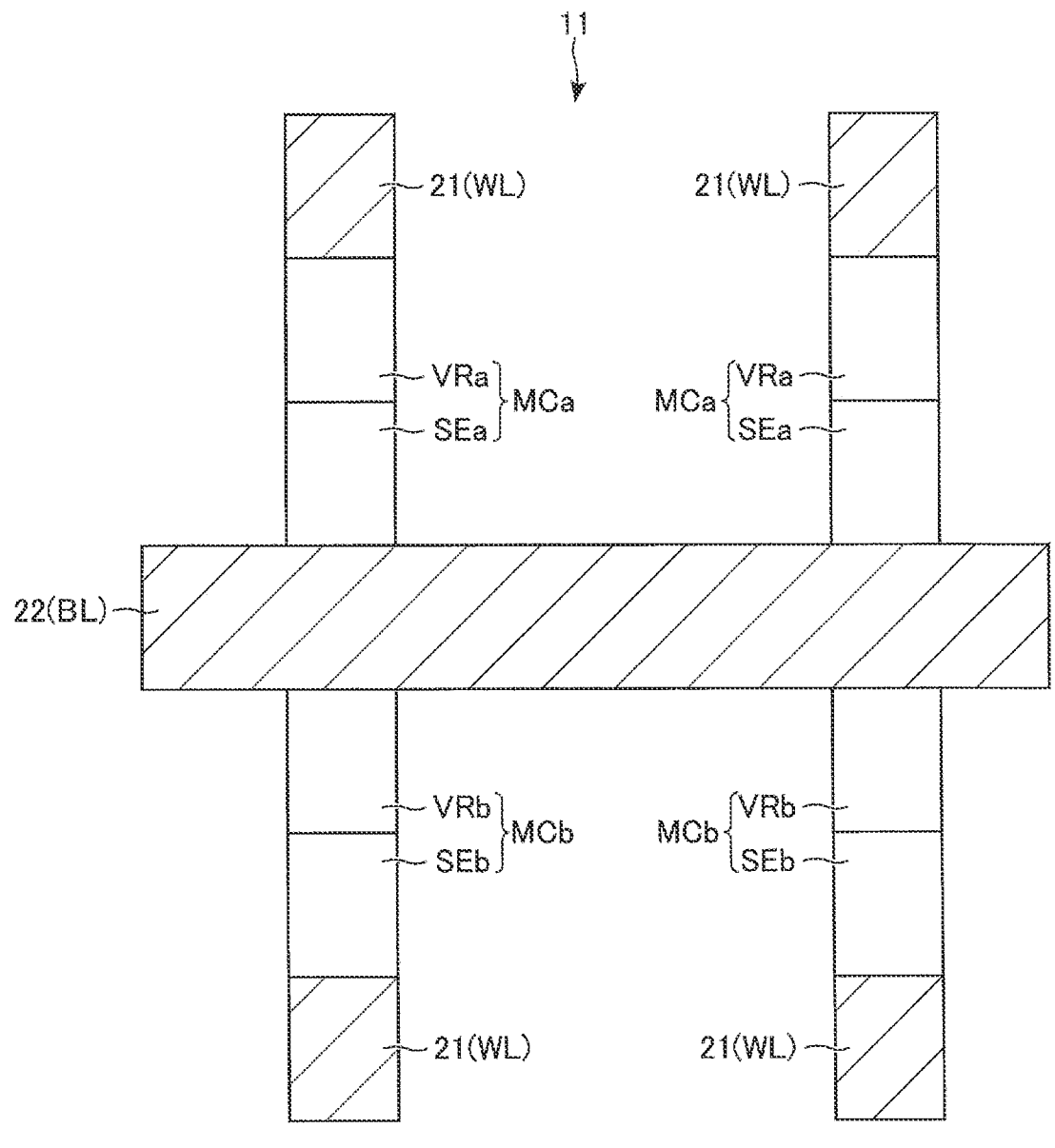
FIG. 3 shows a cross-sectional structure of part of the memory cell array according to the first embodiment.
Figure 4:
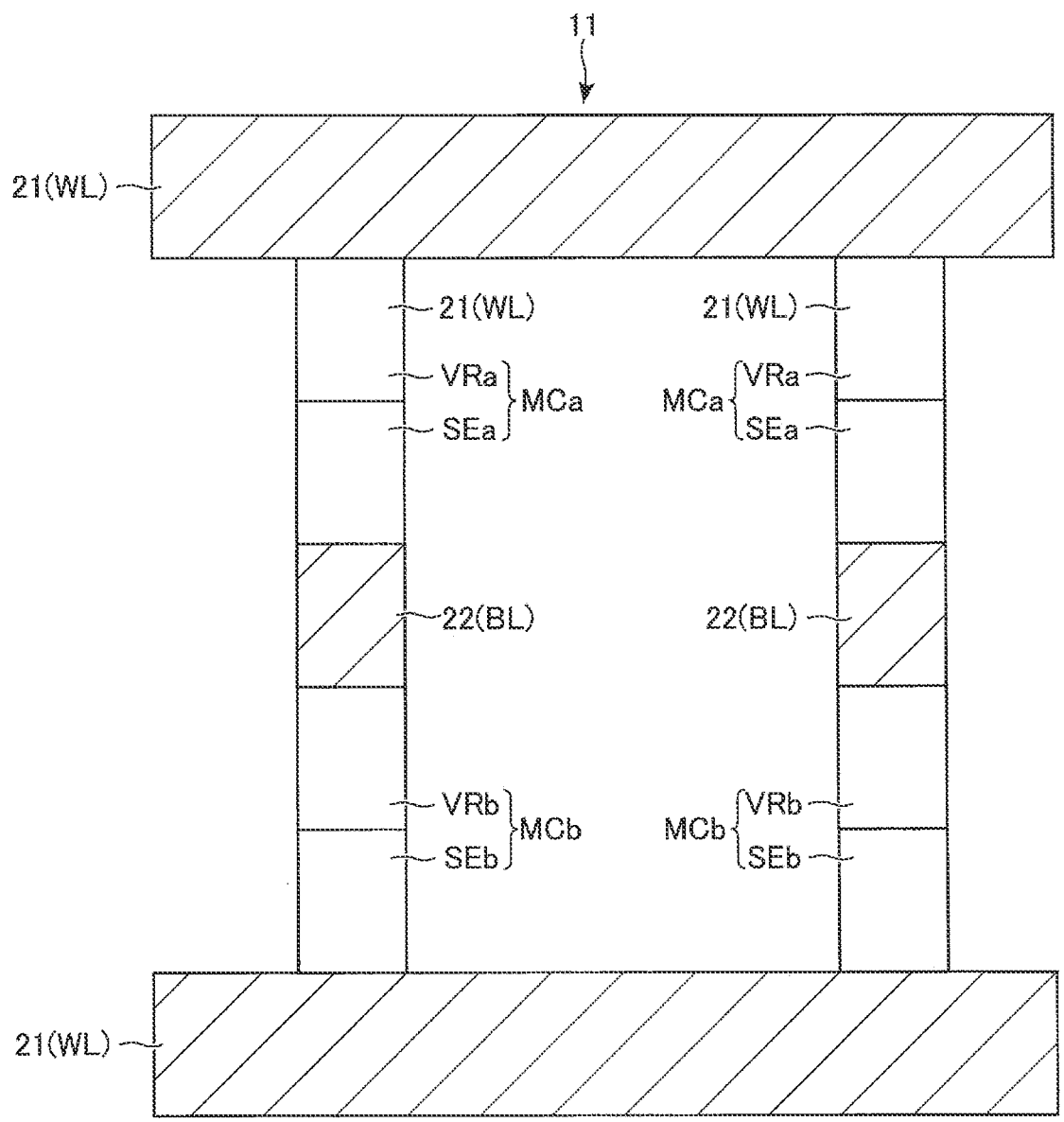
FIG. 4 shows a cross-sectional structure of part of the memory cell array according to the first embodiment.

FIGS. 3 and 4 show a cross-sectional structure of part of the memory cell array 11 of the first embodiment. FIG. 3 shows the dross-section along the xz-plane, and FIG. 4 shows the cross-section along the yz-plane.

As shown in FIGS. 3 and 4, conductors 21 are provided above the semiconductor substrate (not shown). The conductors 21 extend along the y-axis and are aligned along the x-axis. Each conductor 21 functions as a word line WL.

Each conductor 21 is coupled, at its top surface, to the bottom surfaces of memory cells MCb. Each memory cell MCb has, for example, a circular shape in the xy-plane. The memory cells MCb are aligned along the y-axis on each conductor 21, and this arrangement provides a matrix of memory cells MCb over the xy-plane. Each memory cell MCb includes a structure that functions as a switching element SEb and a structure that functions as a magnetoresistance effect element VRb. The structure that functions as a switching element SEb and the structure that functions as a magnetoresistance effect element VRb each have one or more layers, as will be described later.

Conductors 22 are provided above the memory cells MCb. The conductors 22 extend along the x-axis and are aligned along the y-axis. Each conductor 22 is coupled, at its bottom surface, to the top surfaces of memory cells MCb aligned along the x-axis. Each conductor 22 functions as a bit line BL.

Each conductor 22 is coupled, at its top surface, to the bottom surfaces of memory cells MCa. Each memory cell MCa has, for example, a circular shape in the xy-plane. The memory cells MCa are aligned along the x-axis on each conductor 22, and this arrangement provides a matrix of memory cells MCa over the xy-plane. Each memory cell MCa includes a structure that functions as a switching element SEa and a structure that functions as a magneto resistance effect element VRa. The structure that functions as a switching element SEa and the structure that functions as a magnetoresistance effect element VRa each have one or more layers, as will be described later.

A further conductor 21 is provided on the top surfaces of memory cells MCa aligned along the y-axis.

The structure from the layer of the lowermost conductor 21 to the layer of the memory cell MCa shown in FIGS. 3 and 4 is repeatedly provided along the z-axis, thereby making it possible to implement the memory cell array 11 shown in FIG. 2.

The memory cell array 11 further includes an interlayer insulator in a region where none of the conductors 21 and 22 and the memory cell MC are provided.

1.1.4. Structure of Memory Cell

Figure 5:
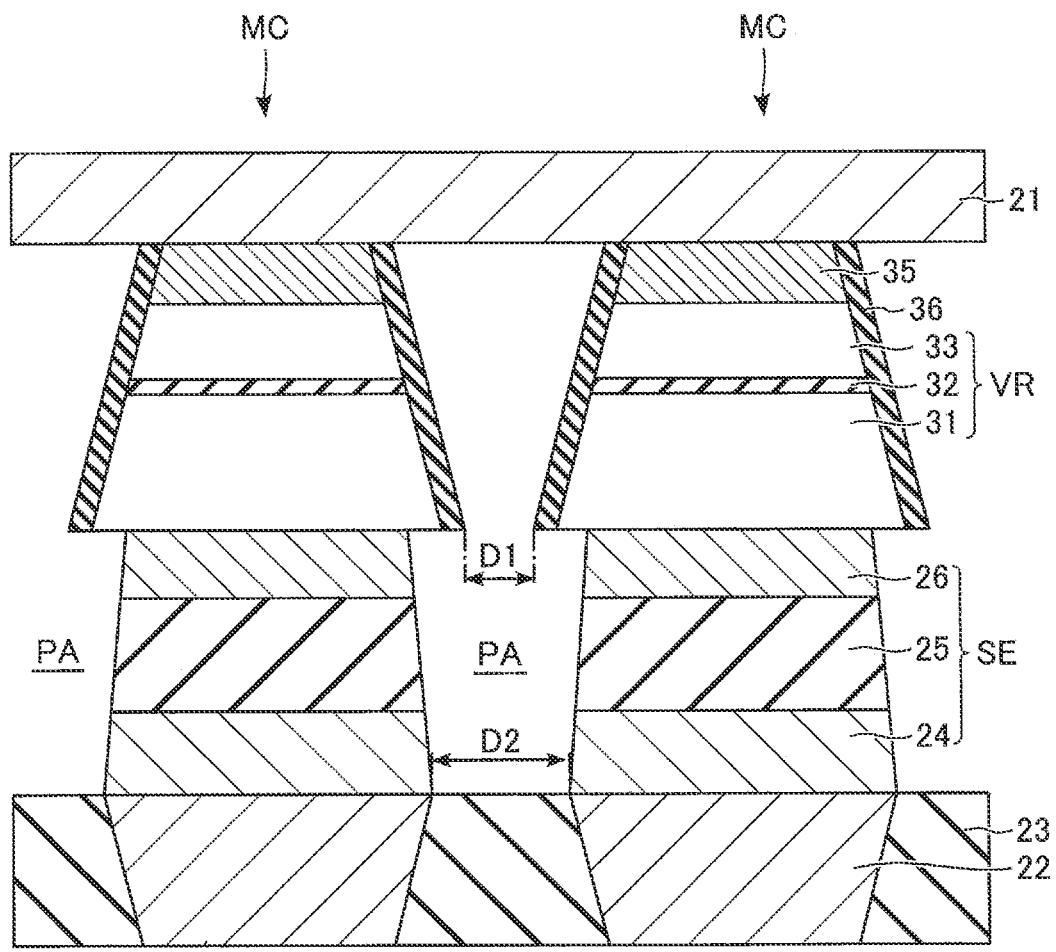
FIG. 5 is a cross-sectional view of an exemplary structure of memory cells according to the first embodiment.

FIG. 5 is a cross-sectional view of an exemplary structure of memory cells according to the first embodiment. FIG. 5 shows a structure from a layer at which a conductor 22 is located to the layer at which the first one of the conductors 21 from the conductor 22 along the z-axis is located. The memory cell MC shown in FIG. 5 corresponds to memory cell MCa.

As shown in FIG. 5, an interlayer insulator 23 is formed above a semiconductor substrate (not shown). A conductor 22 is formed within the interlayer insulator 23. On the top surface of each conductor 22, a memory cell MC is located. Each memory cell MC includes a switching element SE, a magnetoresistance effect element VR, a hardmask 35, and a side-wall insulator 36. The memory cell MC may include additional layers.

Each switching element SE is located on the top surface of a single conductor 22 and its side surface is tapered. Sach switching element SE may have the shape of a truncated cone, for example. When the switching element SE has the shape of a truncated cone, the structure thereof in the cross section differing from the cross section shown in FIG. 5 is the same as the structure shown in FIG. 5 and described hereinafter with reference to FIG. 5.

The switching element SE includes at least a variable resistance material (layer) 25. The switching element SE can further include a lower electrode 24 and an upper electrode 26. In this case, the lower electrode 24 is located on the top surface of the conductor 22, and the variable resistance material 25 is located on the top surface of the lower electrode 24, and the upper electrode 26 is located on the top surface of the variable resistance material 25. The descriptions hereinafter are based on an example where the switching element SE includes a lower electrode 24 and an upper electrode 26.

The lower electrode 24 is located on the top surface of the conductor 22 and either includes or is substantially constituted by titanium nitride (TiN). In the specification and the claims, expressions such as "substantially" and "substantially constituted by" should be construed to mean that an element "substantially constituted by" something may contain unintended impurities.

The variable resistance material 25 is, for example, a switching element between two terminals, the first of which corresponds to one of the top or bottom surface of the variable resistance material 25, the second of which corresponds to the other of the top or bottom surface of the variable resistance material 25. When a voltage applied between two terminals is less than a threshold, the switching element is in a "high-resistance" state, e.g., in an electrically non-conductive state. When a voltage applied between two terminals is equal to or greater than the threshold, the switching element is in a "low-resistance" state, e.g., in an electrically conductive state. The variable resistance material 25 is made of a material constituted by an insulator and contains a dopant introduced by ion injection. The insulator includes, for example, an oxide, and includes $SiO_2$ or a material substantially constituted by $SiO_2$. The dopant contains, for example, arsenic (As) and germanium (Ge).

The upper electrode 26 is located on the top surface of the variable resistance material 25, and contains, or is substantially constituted by, TiN, for example.

A single magnetoresistance effect element VR is located on the top surface of each upper electrode 26. The magnetoresistance effect element VR is tapered on its side surface. Each magnetoresistance effect element VR may have the shape of a truncated cone, for example. When the magnetoresistance effect element VR has the shape of a truncated cone, the structure of the magnetoresistance effect element VR in a cross section differing from that shown in FIG. 5 is the same as the structure shown in FIG. 5 and described hereinafter with reference to FIG. 5.

Each magnetoresistance effect element VR exhibits a tunnel magnetoresistive effect. In the present embodiment and a modification to be described later, the descriptions will be given on the assumption that the magnetoresistance effect element VR is an element having a magnetic tunnel Junction (MTJ). Specifically, the magnetoresistance effect element VR includes a ferromagnetic layer 31, an insulating layer 32, and a ferromagnetic layer 33. As an example, as shown in FIG. 5, the insulating layer 32 is on the top surface of the ferromagnetic layer 31, and the ferromagnetic layer 33 is on the top surface of the insulating layer 32.

The ferromagnetic layer 31 has an easy magnetization axis in a direction penetrating the interfaces between the ferromagnetic layer 31, the insulating layer 32, and the ferromagnetic layer 33, for example at an angle from 45° to 90° with respect to the interfaces, or in a direction orthogonal to the interfaces.

The direction of magnetization of ferromagnetic layer 31 is intended to remain unchanged even when data is read or written in the magnetoresistance memory device 1. The ferromagnetic layer 31 can function as a so-called "reference layer". The ferromagnetic layer 31 may include a plurality of layers.

The insulating layer 32 includes, or is substantially made of, for example, magnesium oxide (MgO), and functions as a so-called "tunnel barrier".

The ferromagnetic layer 33 includes, or is substantially made of, for example, cobalt iron boron (CoFeB) or boride iron (FeB). The ferromagnetic layer 33 has an easy magnetization axis in a direction penetrating the interfaces between the ferromagnetic layer 31, the insulating layer 32, and the ferromagnetic layer 33, for example at an angle from 45° to 90° with respect to the interfaces, or in a direction orthogonal to the interfaces. The magnetization direction of ferromagnetic layer 33 can be changed by data writing, and the ferromagnetic layer 33 can function as a so-called "storage layer".

When the magnetization direction of ferromagnetic layer 33 is parallel to the magnetization direction of ferromagnetic layer 31, magnetoresistance effect element VR is in a state of low resistance. When the magnetization direction of ferromagnetic layer 33 is anti-parallel to the magnetization direction of ferromagnetic layer 31, the magnetoresistance effect element VR is in a state of having a resistance higher than that in the case where the magnetization directions of the ferromagnetic layers 31 and 33 are anti-parallel.

When a certain magnitude of write current flows from the ferromagnetic layer 33 to the ferromagnetic layer 31, the magnetization direction of ferromagnetic layer 33 becomes parallel to the magnetization direction of ferromagnetic layer 31. In contrast, when another magnitude or write current flows from the ferromagnetic layer 31 to the ferromagnetic layer 33, the magnetization direction of ferromagnetic layer 33 becomes anti-parallel to the magnetization direction of ferromagnetic layer 31.

The hardmask 35 is located on the top surface of the magnetoresistance effect element VR, for example the top surface of the ferromagnetic layer 33. The hardmask 35 is made of a conductor, and includes, or is substantially constituted by, TiN, for example.

The side surface of the magnetoresistance effect element VR is covered by a side-wall insulator 36. The side-wall insulator 36 has an etching rate for reactive ion etching (RIE), which is lower than an etching rate for RIE performed on at least one component included in the switching element SE, as will be described below. In the following, the etching rate for RIE may be called an "RIE etching rate". As a more specific example, the side-wall insulator 36 has an RIE etching rate lower than the RIE etching rate for all components included in the switching element SE. According to the currently-described example, the side-wall insulator 36 has an RIE etching rate lower than that of each of the upper electrode 26, the variable resistance material 25, and the lower electrode 24.

In order to have such an RIE etching rate, the side-wall insulator 36 can contain or be substantially constituted by a first material having properties as described below. The first material is an oxide having a bond-dissociation energy of a single bond between the first material and oxygen higher than that of a single bond between oxygen and a material of a single, multiple, or all of the components included in the switching element SE. For example, the first material has a bond-dissociation energy of 500 kJ/mol or greater for a bond between the first material and oxygen. More specific examples of the first material include oxides of hafnium (Hf), aluminum (Al), scandium (Sc), gadolinium (GD), tantalum (Ta), and yttrium (Y). That is, examples of the first material include hafnium oxide (HfO$_2$), aluminum oxide (Al$_2$O$_3$), scandium oxide (Sc$_2$O$_3$), gadolinium oxide (Gd$_2$O$_3$), tantalum oxide (T$_2$O$_5$), and yttrium oxide (Y$_2$O$_3$).

A conductor 21 is provided on the top surface of each of the memory cells MC arranged along the y-axis.

The area PA between the switching elements SE of two neighboring memory cells MC has a dimension described below. A minimum interval D1 between the magnetoresistance effect elements VR of two neighboring memory cells MC is smaller than a minimum interval D2 between the switching elements SE of these memory cells MC. An interval is a distance between the two closest locations of two elements. Since the side surface of each of the magnetoresistance effect element VR and the switching element SE is tapered, the interval D1 is, for example, an interval between the edges of the lower ends of the magnetoresistance effect elements VR of two neighboring memory cells MC. The interval D2 is, for example, an interval between edges of the lower ends of the switching elements SE of two neighboring memory cells MC.

An interlayer insulator 37 is provided in the parts where no elements are provided within the area from the top surface of the interlayer insulator 23 and the top surface of the hardmask 35.

1.2. Manufacturing Method

FIGS. 6 to 11 sequentially show structures of part of the magnetoresistance memory device of the first embodiment in a manufacturing process. FIGS. 6 to 11 show the same cross section as that shown in FIG. 5.

Figure 6:
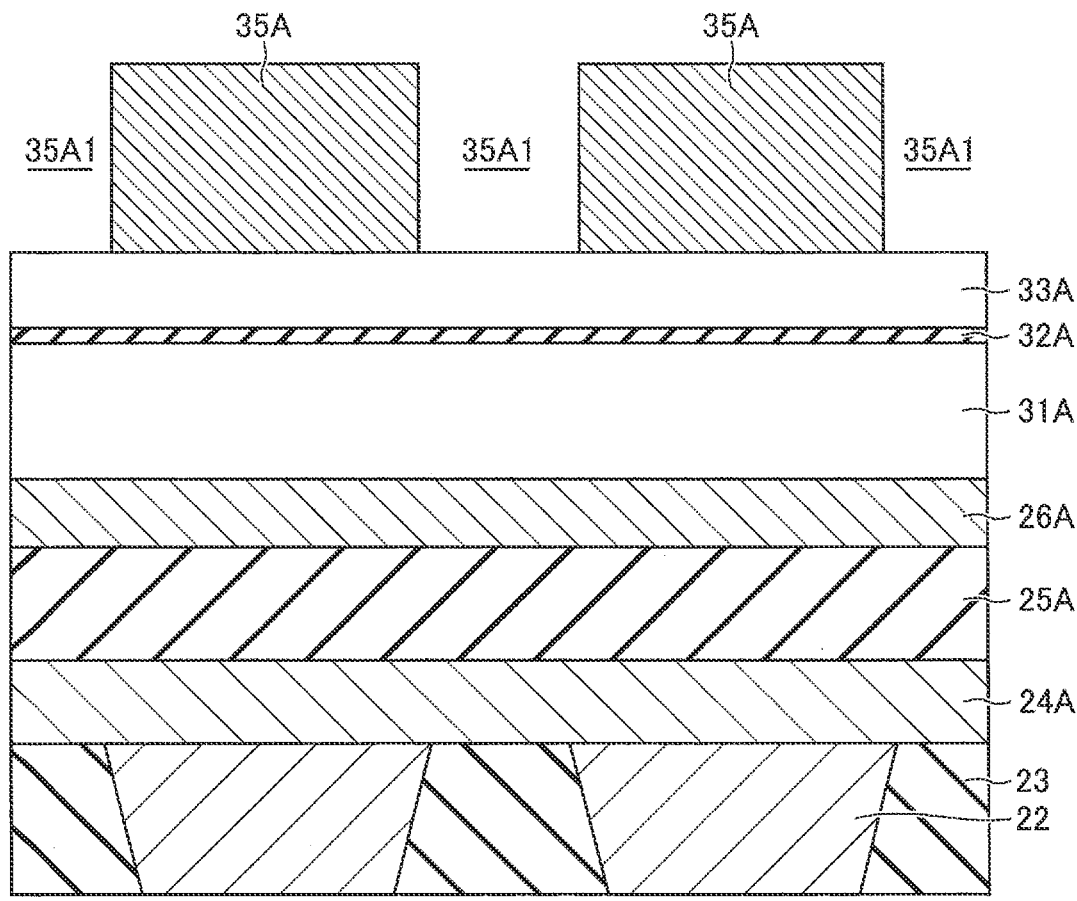
FIG. 6 is a diagram showing a structure of part of the magnetoresistance memory device of the first embodiment at a point in time of a manufacturing process.

As shown in FIG. 6, the conductor 22, the interlayer insulator 23, the lower electrode 24A, the variable resistance material 25A, the upper electrode 26A, the ferromagnetic layer 31A, the insulating layer 32A, the ferromagnetic layer 33A, and the hardmask 35A are formed. Specifically, a plurality of conductors 22 are formed within the interlayer insulator 23. Subsequently, on the top surface of the interlayer insulator 23 and the top surface of the conductor 22, the lower electrode 24A, the variable resistance material 25A, the upper electrode 26A, the ferromagnetic layer 31A, the insulator 32A, the ferromagnetic layer 33A, and the hardmask 35A are deposited in this order. The example of the deposition method includes chemical vapor deposition (CVD) and sputtering. The lower electrode 24A, the variable resistance material 25A, the upper electrode 26A, the ferromagnetic layer 31A, the insulator 32A, the ferromagnetic layer 33A are the components that are shaped into lower electrodes 24, variable resistance materials 25, upper electrodes 26, ferromagnetic layers 31, insulators 32, ferromagnetic layers 33 in a later stage, respectively. The hardmask 35A remains immediately above the areas in which the magnetoresistance effect elements VR are slated to be formed, and has openings 35A1 in other areas. Each opening 35A1 spans the top surface to the bottom surface of the hardmask 35A.

The interval between the memory cells MC is dependent on an area size of the opening 35A1. For the purpose of arranging the memory cells MC in a high-density manner, the area size of the opening 35A1 is extremely narrow.

As shown in FIG. 7, a plurality of sets of the ferromagnetic layer 31, the insulating layer 32, and the ferromagnetic layer 33 are formed. Specifically, the structure obtained through the manufacturing steps far is partially removed by ion beam etching (IBE). The ion beam has an angle with respect to the z-axis. Such ion beam intrudes into the opening 35A1 of the hardmask 35A and partially removes the exposed components in the opening 35A1. Part of the ion beam is blocked by the hardmask 35A, in other words by the shadowing effect of the hardmask 35A, and cannot reach deeper areas of the opening 35A1. However, the hardmask 35A is also partially removed by the IBE, and the top surface level of the hardmask 35A gradually becomes lower as the IBE progresses. As a result, the ion beam can reach deeper areas in the opening 35A1 as the IBE progresses. The IBE is continued at least until the ferromagnetic layer 31A, the insulating layer 32A, and the ferromagnetic layer 33A are partially removed and multiple sets of the ferromagnetic layer 31, the insulating layer 32, and the ferromagnetic layer 33 are thereby formed. The IBE is performed, with a targeted structure being rotated around the z-axis. For this reason, as the IBE progresses, the edge of an element subjected to the etching in the xy plane comes uniformly closer towards its own center. The IBE causes the top surface of the upper electrode 26A to be partially exposed between the structures each constituted by a group of the hardmask 35A and the set of the ferromagnetic layer 31, the insulating layer 32, and the ferromagnetic layer 33 (this structure may be called a "cell layer stack").

As previously mentioned, the area size of the opening 35A1 is extremely small so as to achieve high population of the memory cells MC. For this reason, the area size of an area VA in the xy plane between neighboring cell layer stacks is also extremely small, as is the width or diameter of the area VA in the xy plane. In other words, the aspect ratio of the area VA is very high. Hereinafter, the term "width" refers to a length on a line that crosses the center of the xy plane, for example. Due to the extremely high aspect ratio of the area VA and the shadowing effect by the hardmask 35A, the cell layer stack has a tapered shape in its side surface. In other words, the cell layer stack has wider bottom edge than top edge. Thus, the width of the bottom surface of the area VA, namely the distance between the edges of the bottom surfaces of the neighboring cell layer stacks, is smaller than the width of the top surface of the area VA, namely the distance between the edges of the bottom surfaces of the neighboring cell layer stacks. In other words, the side surface of the area VA is in the shape of a reverse taper. The bottom surface of the area VA is extremely narrow due to the narrow interval between cell layer stacks.

Figure 8:
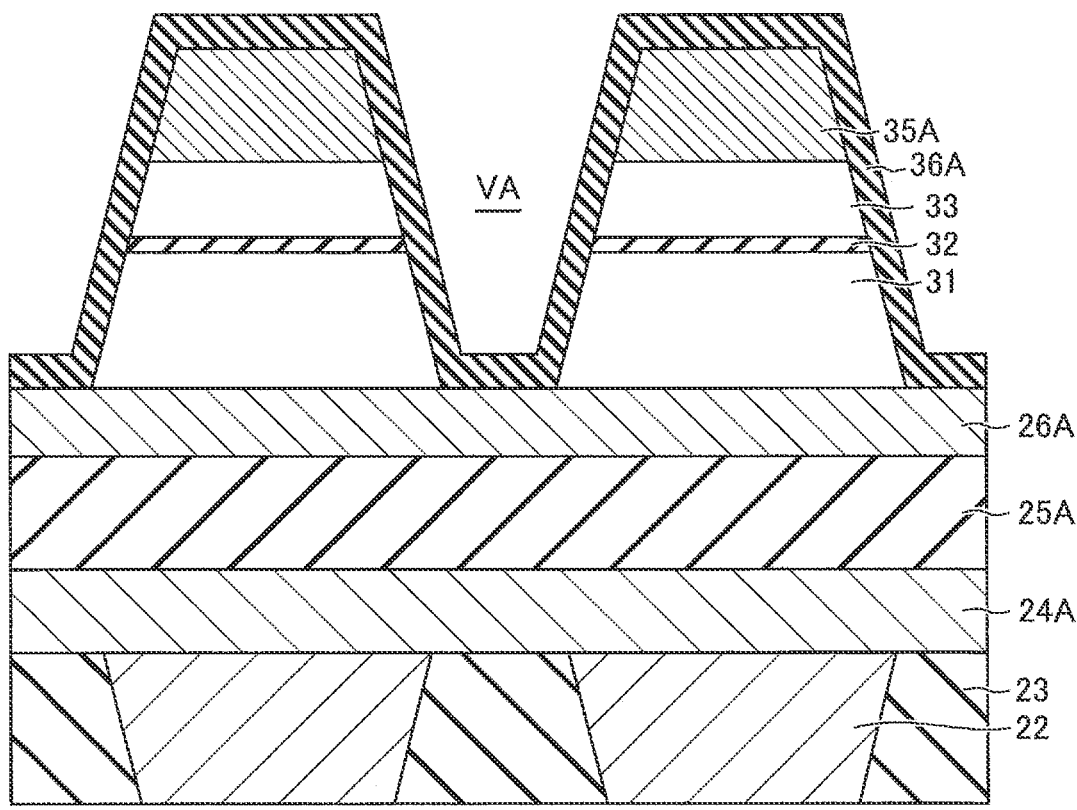
FIG. 8 is a diagram showing a structure at a point in time subsequent to that shown in FIG. 7.
Figure 8:
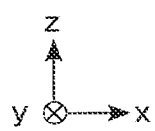

As shown in FIG. 8, an insulator 36A is deposited on the entire top surface of the structure obtained through the manufacturing steps so far. The insulator 35A is a component slated to be shaped into a side-wall insulator 36 in a later stage. The insulator 36A covers the exposed parts of the top surface of the upper electrode 26A, the side surfaces of the cell layer stacks (the side surfaces of the ferromagnetic layer 31, the insulating layer 32, the ferromagnetic layer 33, and the hardmask 35A), and the top surface of the hardmask 35A.

Figure 9:
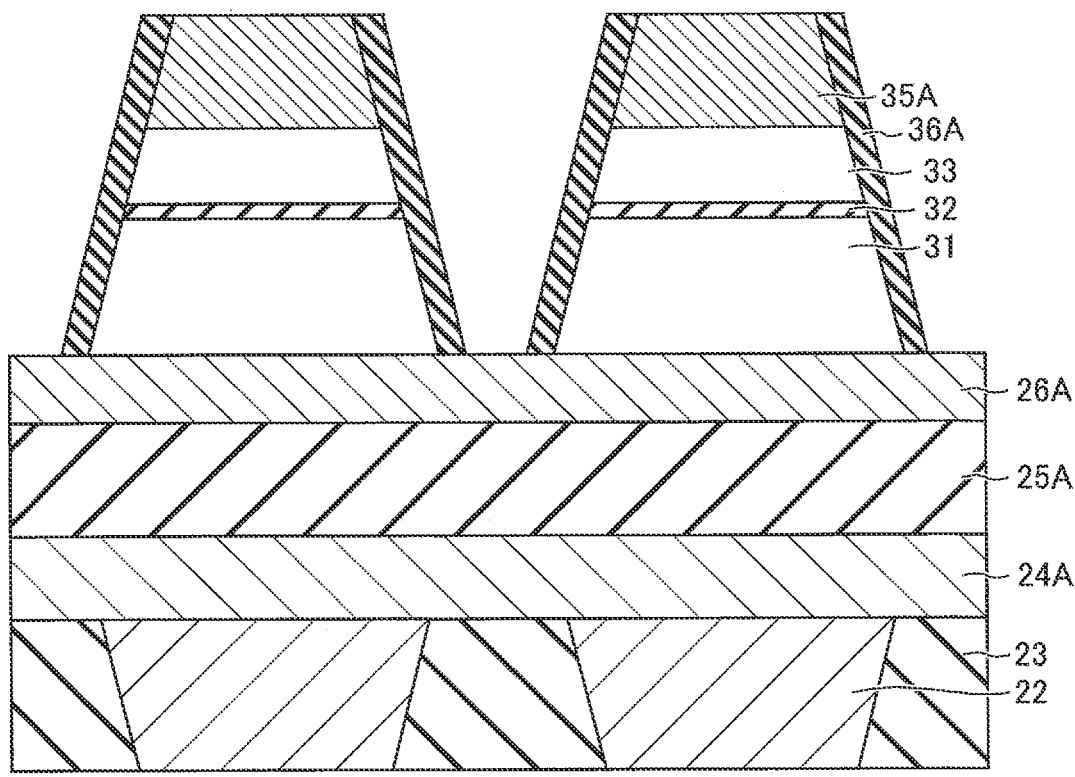
FIG. 9 is a diagram showing a structure at a point in time subsequent to that shown in FIG. 8.

As shown in FIG. 9, etch back is performed on the insulator 36A. This process of etch back removes the insulator 36A deposited on the exposed portions of the top surface of the upper electrode 26A and on the upper-surface portions of the hardmask 35A. As a result, of the top surface of the upper electrode 26A, the portions between the cell layer stacks are exposed. Furthermore, the etch back thins the insulator 36A deposited on the side surface portions of the ferromagnetic layer 31, the insulating layer 32, the ferromagnetic layer 33, and the hardmask 35A.

Figure 10:
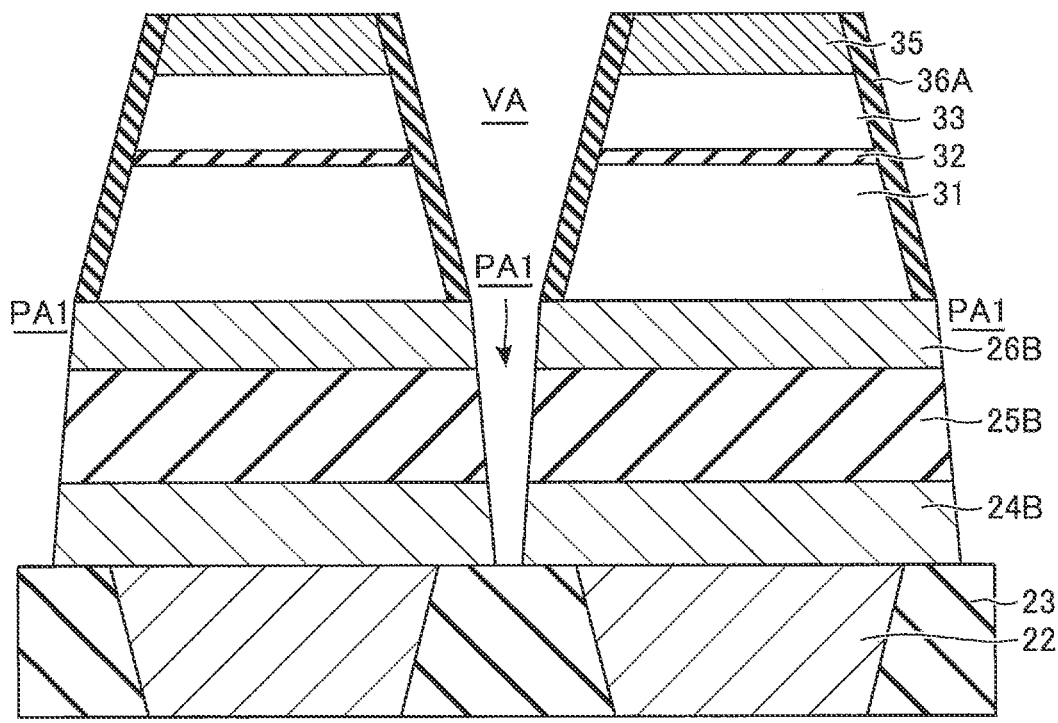
FIG. 10 is a diagram showing a structure at a point in time subsequent to that shown in FIG. 9.
Figure 10:
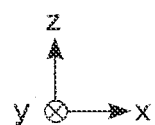

As shown in FIG. 10, a plurality of sets of the upper electrode 26B, the variable resistance material 25B, and the lower electrode 24B are formed. Specifically, RIE is performed on the structure obtained through the manufacturing steps so far. The ions in the RIE intrude into the area VA between the cell layer stacks and remove the top surface of the upper electrode 26A therein. In the lower portion of the area VA, the RIE partially removes the upper electrode 26A, the variable resistance material 25A, and the lower electrode 24A, as the RIE progresses. In the RIE, the cell layer stacks and the insulators 36A function as a mask. The RIE is continued until the lower electrode 24A forms an opening spanning from the top surface to the bottom surface of the lower electrode 24A below the area VA. By the RIE, the upper electrode 26A, the variable resistance material 25A, and the lower electrode 24A are shaped. As a result of the shaping, an area PA1 is formed below the area VA, and a plurality of sets of the upper electrode 26B, the variable resistance material 25B, and the lower electrode 24B are formed. A set of the upper electrode 26B, the variable resistance material 25B, and the lower electrode 24B may be called a "switching element layer stack" hereinafter. A switching element layer stack is located below a cell layer stack.

The width or diameter of the opening of the area PA1 (namely, the width or diameter at the same height as the top surface of the upper electrode 26B) is equal to an interval of the lower edges of neighboring cell layer stacks (or the width or diameter of the lower edge of the area VA). As mentioned previously, the interval of the lower edges of neighboring cell layer stacks is extremely narrow. This renders the opening of the area PA1 also extremely narrow.

The RIE is isotropic. However, the side surface of the switching element layer stack is tapered, partly due to the narrow opening of the area PA1, and partly due to a large ratio of the opening to the thickness of the set of the upper electrode 26B, the variable resistance material 25B, and the lower electrode 24B, which is a target of the RIE. In other words, the width of the bottom surface of the area PA1, namely the distance between the edges of the bottom surfaces of neighboring switching element layer stacks, is narrower than the width of the bottom surface of the area VA, namely the distance between the edges of the top surfaces of neighboring switching element layer stacks. In other words, the side surface of the area PA1 is tapered. Due to the narrow opening of the area PA1 and the tapered side surface of the area PA1, the width or diameter of the bottom surface of the area PA1 is extremely small. Thus, the interval between the lower edges of neighboring cell layer stacks is extremely small.

Figure 11:
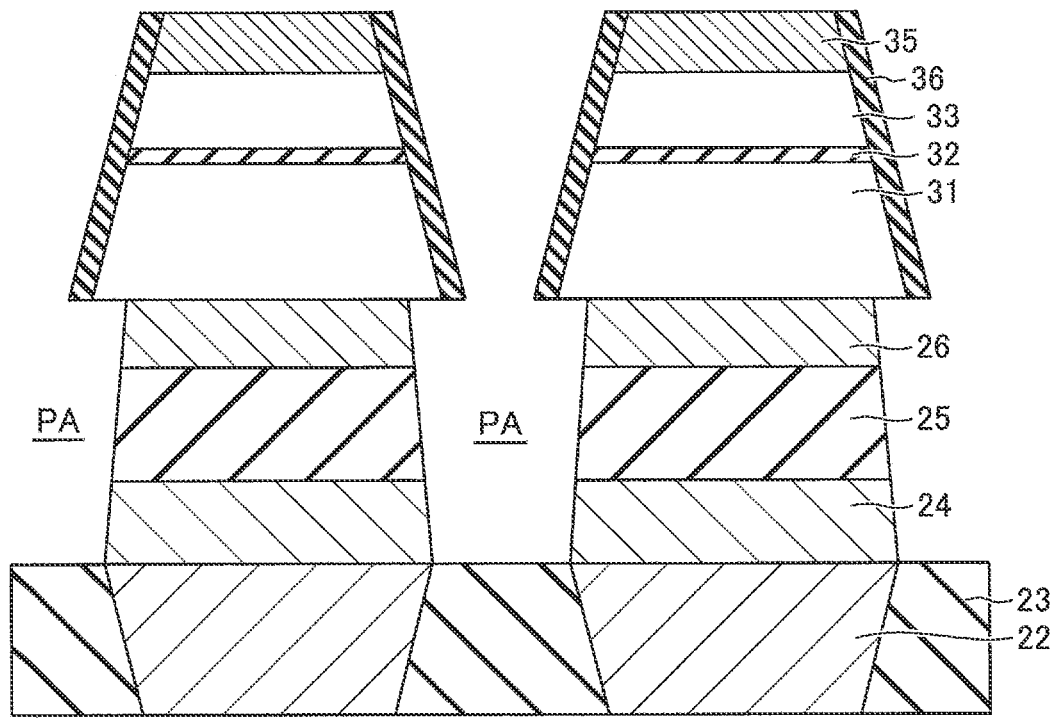
FIG. 11 is a diagram showing a structure at a point in time subsequent to that shown in FIG. 10.

As shown in FIG. 11, the RIE in the step shown in FIG. 10 is continued, and a plurality of sets of the upper electrode 26, the variable resistance material 25, and the lower electrode 24 are thereby formed. Specifically, as the RIE progresses, the side surfaces of the upper electrode 26B, the variable resistance material 25B, and the lower electrode 24B are further removed, and the width or diameter of each of the upper electrode 26B, the variable resistance material 25B, and the lower electrode 24B is further decreased. As a result, a plurality of sets of the upper electrode 26, the variable resistance material 25, and the lower electrode 24 are formed, and the area PA1 becomes the area PA.

The RIE shown in FIGS. 10 and 11 also thins the insulator 36A. As described with reference to FIG. 5, the insulator 36A (the side-wall insulator 36) has a lower RIE etching rate than that of at least one component included in the switching element SE, and for example a lower RIE etching rate than that of each of the upper electrode 26, the variable resistance material 25, and the lower electrode 24. For this reason, the thickness of the insulator 36A is not greatly decreased by the RIE. The insulator 36A is not completely removed at least until the RIE is finished, namely until a plurality of sets of the upper electrode 26, the variable resistance material 25, and the lower electrode 24 are formed from the upper electrode 26A, the variable resistance material 25A, and the lower electrode 24A. In other words, the insulator 36A formed in the step shown in FIG. 8 has a thickness that allows the side-wall insulator 36 to remain even after the RIE, in consideration of a period of time for which the RIE needs to be continued until the upper electrode 26, the variable resistance material 25, and the lower electrode 24 are formed. Therefore, as a result of the RIE, the side-wall insulator 36 is formed from the insulator 36A.

Figure 12:
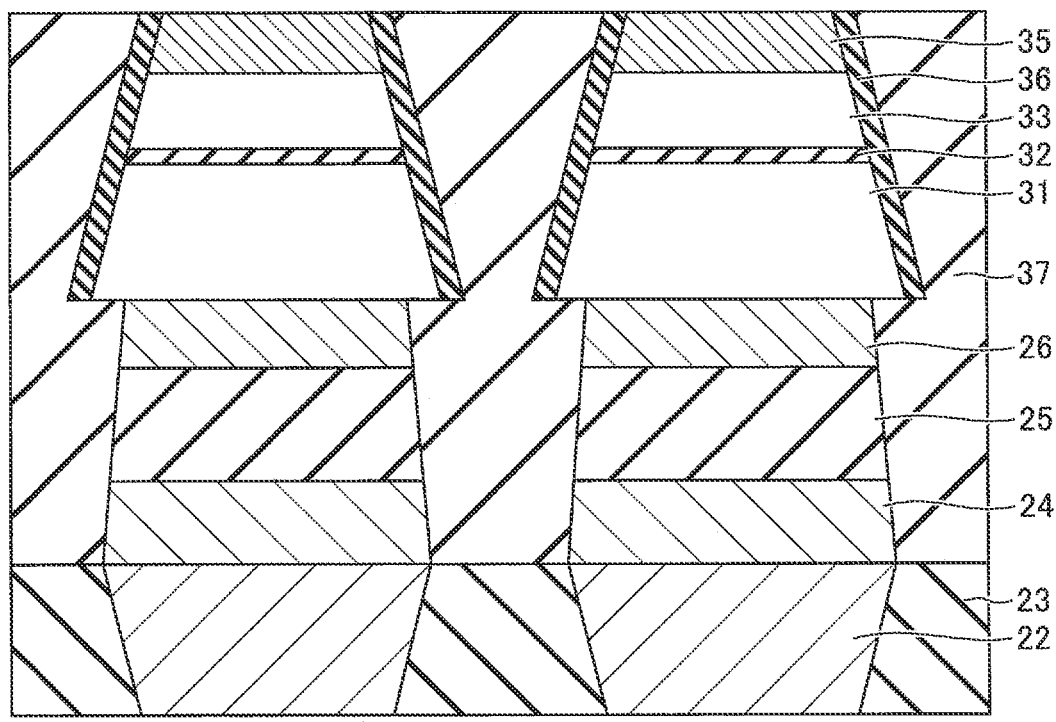
FIG. 12 is a diagram showing a structure at a point in time subsequent to that shown in FIG. 11.

As shown in FIG. 12, an interlayer insulator 37 is provided in the parts where no components are formed within the area from the top surface of the interlayer insulator 23 and the top surface of the hardmask 35.

As shown in FIG. 5, the conductor 21 is formed on the top surface of the interlayer insulator 37 and the top surface of the hardmask 35.

1.3. Advantageous Effects

According to the first embodiment, as described hereinafter, it is possible to provide a magnetoresistance memory device capable of suppressing electrical breakdown and degradation in magnetic characteristics of memory cells MC.

Figure 14:
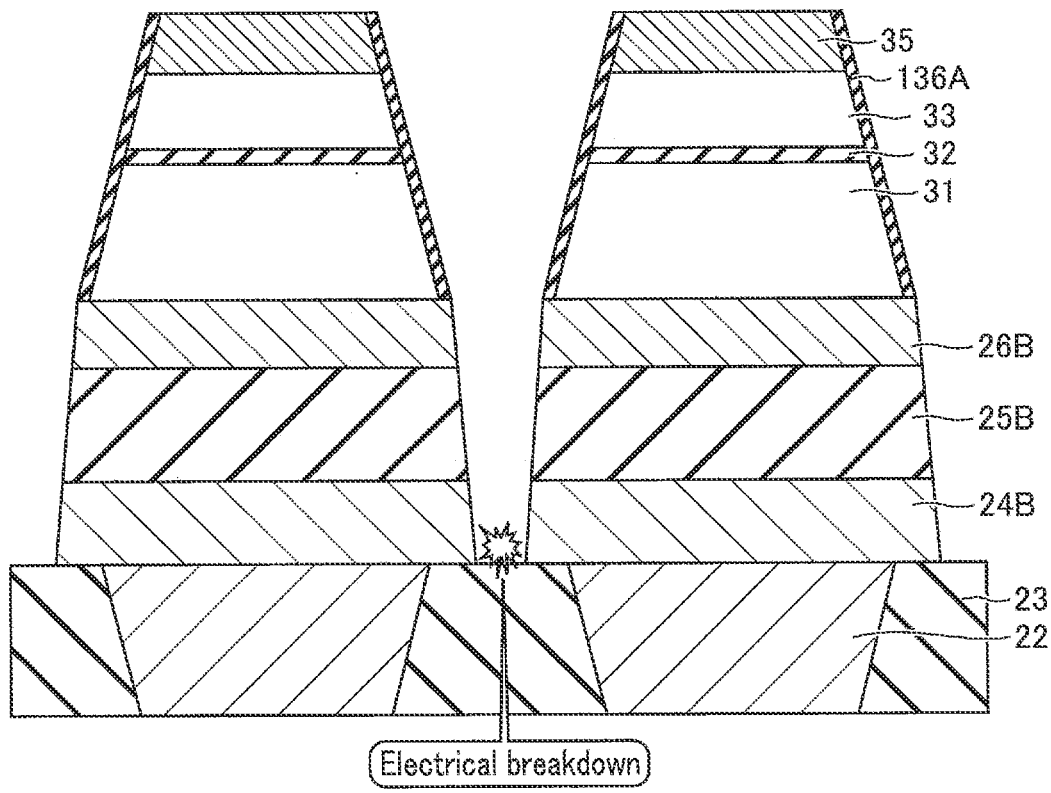
FIG. 14 is a diagram showing a structure at a point in time subsequent to that shown in FIG. 13.
Figure 15:
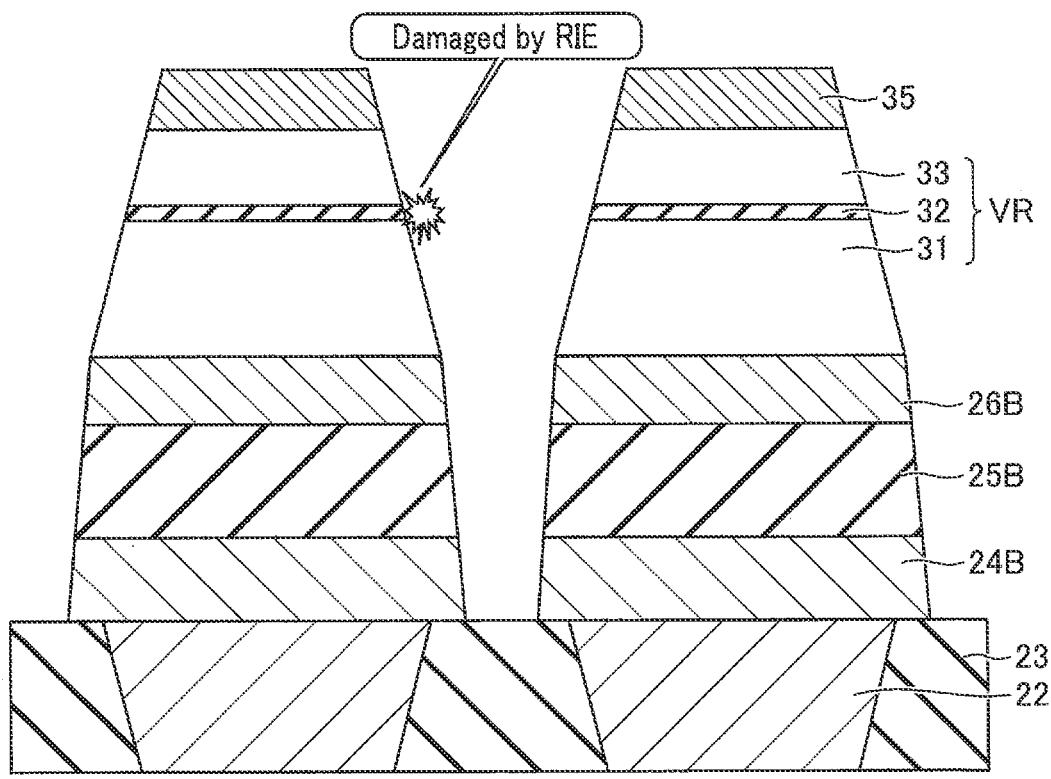
FIG. 15 is a diagram showing a structure at a point in time subsequent to that shown in FIG. 14.

The structure shown in FIG. 5 can be manufactured in the following steps. FIGS. 13 to 15 show a state in a reference process of manufacturing a magnetoresistance memory device 1, and a structure corresponding to the part of the magnetoresistance memory device shoran in FIG. 5.

As shown in FIG. 13, the same process as that up to the step shown in FIG. 9 in the first embodiment is performed. In the reference manufacturing process, an insulator 136A is deposited instead of the insulator 36A of the first embodiment. The insulator 136A is a component intended to have the same functions as the insulator 36A and to be shaped into a side-wall insulator having the same functions as the side-wall insulator 36. Unlike the side-wall insulator 36, the insulator 136A does not have a low RIE etching rate, and is made of silicon nitride ($Si_3N_4$), for example.

As shown in FIG. 14, the upper electrode 26B, the variable resistance material 25B, and the lower electrode 24B are formed by the RIE through the same manufacturing steps as those shown in FIGS. 10 and 11 of the first embodiment. Since the insulator 136A does not have a low RIE etching rate, the insulator 136A thins in a short period of time under the RIE. The RIE must be stopped before all the insulator 136A is removed. Since the insulator 136A is thinned at a high speed, the length of time in which the RIE can be performed is short. For this reason, at the time when the RIE is finished, the intervals between upper electrodes 26B, variable resistance materials 25B, and lower electrodes 24B are extremely narrow. Thus, electric breakdown tends to occur at these intervals. Depending on the case, there may be instances of the formation of the upper electrode 26B, the variable resistance material 25B, and the lower electrode 24B not being fully completed. In such cases, the upper electrodes 26B, the variable resistance materials 25B, and/or the lower electrodes 24B are mutually coupled between neighboring memory cells MC. Such a structure renders those memory cells MC unusable.

In order to suppress and/or prevent such electric breakdown and/or incapability of memory cell formation, it may be possible for the RIE to be continued. FIG. 15 indicates a state that follows that shown in FIG. 14. As shown in FIG. 15, if the RIE continues, the insulator 136A may be completely removed. The loss of the insulator 136A causes the side surface of the magnetoresistance effect element VR to be exposed. The exposed side surface is damaged by the RIE and the magnetic characteristics of the damaged magnetoresistance effect element VR are degraded. The magnetoresistance effect element VR having degraded magnetic characteristics may not exhibit the desired performance.

It is the silicon nitride of the insulator 136A that causes the phenomenon described with reference to FIGS. 13 to 15. One reason for using silicon nitride is that it exhibits excellent performance when serving as the side wall of the magnetoresistance effect element VR. When transistors were used in the memory cells MC, instead of switching elements SE which enable a highly populated arrangement of memory cells MC, there was no necessity to use the RIE in order to form switching elements SE. For this reason, the phenomenon described with reference to FIGS. 13 to 15 did not occur. It was found, however, that the use of switching elements SE causes the phenomenon described with reference to FIGS. 13 to 15. Accordingly, it is desirable to use switching elements SE and suppress or prevent the phenomenon shown in FIGS. 13 to 15.

According to the first embodiment, the side-wall insulator 36 has a lower RIE etching rate than that of at least one component included in the switching element SE, and for example a lower RIE etching rate than that of each of the upper electrode 26, the variable resistance material 25, and the lower electrode 24. For this reason, a good amount of the side-wall insulator 36 can remain and, at the same time, the RIE performed on the upper electrode 26A, the variable resistance material 25A, and the lower electrode 24A can be continued for a long period of time. For this reason, the interval between the upper electrodes 26, the interval between the variable resistance materials 25, and/or the interval between the lower electrodes 24 can be wide. This renders it difficult to cause electrical breakdown between the upper electrodes 26, the variable resistance materials 25, and/or the lower electrodes 24. At the same time, because the side-wall insulator 36 is present (remains), the degradation of the magnetic characteristics of the magnetoresistance effect element VR are suppressed or prevented. Therefore, it is possible to provide a magnetoresistance memory device capable of suppressing electrical breakdown while suppressing degradation in magnetic characteristics of memory cells MC.

1.4. Modifications

The foregoing descriptions relate to an example in which a ferromagnetic layer 33 capable of functioning as a so-called "storage layer" is located above a ferromagnetic layer 31 capable of functioning as a so-called "reference layer". However, the first embodiment is not limited to this example. That is, a magnetoresistance effect element VR may include a ferromagnetic layer 31 capable of functioning as a "so-called" reference layer located above a ferromagnetic layer 33 capable of functioning as a so-called "storage layer".

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A magnetoresistance memory device, comprising:
a first switching element and a second switching element that each include a variable resistance material;
a first layer stack and a second layer stack on the first switching element and the second switching element respectively, each of the first layer stack and the second layer stack including a first ferromagnetic layer, a second ferromagnetic layer, and an insulating layer between the first ferromagnetic layer and the second ferromagnetic layer;
a first insulator on a side surface of the first layer stack; and
a second insulator on a side surface of the second layer stack,
wherein a narrowest interval between the first insulator and the second insulator is narrower than a narrowest interval between the first switching element and the second switching element.
2. The device according to claim 1, wherein
the first insulator covers the side surface of the first layer stack, and
the second insulator covers the side surface of the second layer stack.

3. The device according to claim 1, wherein
each of the first switching element and the second switching element comprises a bi-directional switching element.

4. The device according to claim 1, wherein
the variable resistance material comprises a silicon oxide containing arsenic or germanium.

5. The device according to claim 1, wherein
each of the first insulator and the second insulator comprises an oxide having a bond-dissociation energy of 500 kJ/mol or greater for a bond between the oxide and oxygen.

6. The device according to claim 1, wherein
each of the first insulator and the second insulator comprises hafnium oxide, aluminum oxide, scandium oxide, gadolinium oxide, tantalum oxide, or yttrium oxide.

7. The device according to claim 1, wherein
the narrowest interval between the first insulator and the second insulator is an interval between a lower edge of the first insulator and a lower edge of the second insulator, and
the narrowest interval between the first switching element and the second switching element is an interval between a lower edge of the first switching element and a lower edge of the second switching element.

8. The device according to claim 1, wherein
each of the first switching element and the second switching element comprises:
a first conductor;
the variable resistance material on the first conductor; and
a second conductor on the variable resistance material.

9. A magnetoresistance memory device comprising:
a switching element that includes a variable resistance material;
a layer stack on the switching element, the layer stack including a first ferromagnetic layer, a second ferromagnetic layer and an insulating layer between the first ferromagnetic layer and the second ferromagnetic layer; and
hafnium oxide, aluminum oxide, scandium oxide, gadolinium oxide, tantalum oxide, or yttrium oxide on a side surface of the layer stack.

10. The device according to claim 9, wherein
hafnium oxide, aluminum oxide, scandium oxide, gadolinium oxide, tantalum oxide, or yttrium oxide covers a side surface of the layer stark.

11. The device according to claim 9, wherein
the variable resistance material comprises a silicon oxide containing arsenic or germanium.

12. The device according to claim 9, wherein
the switching element comprises:
a first conductor;
the variable resistance material on the first conductor; and
a second conductor on the variable resistance material.

13. A method of manufacturing a magnetoresistance memory device, comprising:
forming a first layer stack that includes a variable resistance material;
forming a second layer stack and a third layer stack on the first layer stack, each of the second layer stack and the third layer stack including a first ferromagnetic layer, a second ferromagnetic layer, and an insulating layer between the first ferromagnetic layer and the second ferromagnetic layer;
forming, on a side surface of the second layer stack, a first insulator comprising a first material having an etching rate for first etching lower than an etching rate of the first stack layer for the first etching;
forming a second insulator comprising the first material on a side surface of the third layer stack; and
partially removing the first layer stack by the first etching, using the second layer stack, the third layer stack, and the first insulator, and the second insulator as a mask.

14. The method according to claim 13, wherein
the forming of the first layer stack comprises:
forming a first conductor;
forming the variable resistance material on the first conductor;
forming a second conductor on the variable resistance material, and
wherein the first material has an etching rate for the first etching lower than an etching rate of each of the first conductor, the variable resistance material, and the second conductor for the first etching.

15. The method according to claim 14, wherein
the forming of the variable resistance material comprises forming a silicon oxide containing arsenic or germanium.

16. The method according to claim 13, wherein
the first etching comprises causing the first insulator and the second insulator to remain.

17. The method according to claim 13, wherein
the first etching comprises reactive-ion etching.

18. The method according to claim 13, wherein
each of the first insulator and the second insulator comprises an oxide having a bond-dissociation energy of 500 kJ/mol or greater for a bond between the oxide and oxygen.

19. The method according to claim 13, wherein
each of the first insulator and the second insulator comprises hafnium oxide, aluminum oxide, scandium oxide, gadolinium oxide, tantalum oxide, or yttrium oxide.

20. The method according to claim 13, wherein
the forming of the second layer stack and the third layer stack comprises:
forming a third ferromagnetic layer on the first layer stack;
forming a second insulating layer above the third ferromagnetic layer;
forming a fourth ferromagnetic layer above the second insulating layer; and
performing ion beam etching on the third ferromagnetic layer, the second insulating layer, and the fourth ferromagnetic layer.

* * * * *